United States Patent
Lin et al.

(10) Patent No.: US 11,682,625 B2
(45) Date of Patent: *Jun. 20, 2023

(54) INTERCONNECTION STRUCTURE, FABRICATING METHOD THEREOF, AND SEMICONDUCTOR DEVICE USING THE SAME

(71) Applicant: Taiwan Semiconductor Manufacturing Co., Ltd., Hsinchu (TW)

(72) Inventors: Yu-Hung Lin, Taichung (TW); Chi-Wen Liu, Hsinchu (TW); Horng-Huei Tseng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 26 days.

This patent is subject to a terminal disclaimer.

(21) Appl. No.: 17/359,083

(22) Filed: Jun. 25, 2021

(65) Prior Publication Data

US 2021/0327814 A1 Oct. 21, 2021

Related U.S. Application Data

(63) Continuation of application No. 16/576,599, filed on Sep. 19, 2019, now Pat. No. 11,049,813, which is a (Continued)

(51) Int. Cl.
*H01L 23/48* (2006.01)
*H01L 23/52* (2006.01)
(Continued)

(52) U.S. Cl.
CPC ...... *H01L 23/535* (2013.01); *H01L 21/28518* (2013.01); *H01L 21/76805* (2013.01);
(Continued)

(58) Field of Classification Search
CPC combination set(s) only.
See application file for complete search history.

(56) References Cited

U.S. PATENT DOCUMENTS 5,587,338 A 12/1996 Tseng
6,008,141 A 12/1999 Ibara et al.
(Continued)

FOREIGN PATENT DOCUMENTS

CN 1574398 A 2/2005
CN 102437098 A 5/2012
(Continued)

OTHER PUBLICATIONS

Xiao, Hong, Introduction to Semiconductor Manufacturing Technology, Prentice Hall, 2 pages.
(Continued)

*Primary Examiner* — Niki H Nguyen
(74) *Attorney, Agent, or Firm* — Slater Matsil, LLP

(57) ABSTRACT

A semiconductor device includes a semiconductor substrate comprising a contact region, a silicide present on the contact region, a dielectric layer present on the semiconductor substrate, the dielectric layer comprising an opening to expose a portion of the contact region, a conductor present in the opening, a barrier layer present between the conductor and the dielectric layer, and a metal layer present between the barrier layer and the dielectric layer, wherein a Si concentration of the silicide is varied along a height of the silicide.

20 Claims, 16 Drawing Sheets

Related U.S. Application Data continuation of application No. 15/665,229, filed on Jul. 31, 2017, now Pat. No. 10,483,208, which is a continuation of application No. 14/992,997, filed on Jan. 11, 2016, now Pat. No. 9,721,896.

(60) Provisional application No. 62/217,774, filed on Sep. 11, 2015.

(51) Int. Cl.

| | |
|---|---|
| *H01L 29/40* | (2006.01) |
| *H01L 23/535* | (2006.01) |
| *H01L 21/768* | (2006.01) |
| *H01L 23/532* | (2006.01) |
| *H01L 21/285* | (2006.01) |
| *H01L 29/66* | (2006.01) |
| *H01L 29/417* | (2006.01) |
| *H01L 27/092* | (2006.01) |
| *H01L 29/786* | (2006.01) |
| *H01L 21/8238* | (2006.01) |
| *H01L 29/08* | (2006.01) |
| *H01L 29/45* | (2006.01) |
| *H01L 23/485* | (2006.01) |

(52) U.S. Cl.
CPC .. *H01L 21/76889* (2013.01); *H01L 21/76895* (2013.01); *H01L 21/823821* (2013.01); *H01L 23/53266* (2013.01); *H01L 27/0924* (2013.01); *H01L 29/0847* (2013.01); *H01L 29/41733* (2013.01); *H01L 29/66772* (2013.01); *H01L 29/66795* (2013.01); *H01L 29/78696* (2013.01); *H01L 21/76843* (2013.01); *H01L 21/76855* (2013.01); *H01L 23/485* (2013.01); *H01L 29/458* (2013.01); *H01L 29/66545* (2013.01)

(56) References Cited

U.S. PATENT DOCUMENTS

| | | | |
|---|---|---|---|
| 6,534,402 B1 | 3/2003 | Liao | |
| 6,713,779 B2 | 3/2004 | Tezuka et al. | |
| 8,466,027 B2 | 6/2013 | Chen et al. | |
| 9,035,368 B2 | 5/2015 | Shimamoto | |
| 9,721,896 B2* | 8/2017 | Lin | H01L 21/28518 |
| 2003/0045093 A1 | 3/2003 | Givens et al. | |
| 2003/0129831 A1 | 7/2003 | Hu | |
| 2004/0192026 A1 | 9/2004 | Chen et al. | |
| 2008/0157208 A1* | 7/2008 | Fischer | H01L 29/7843 |
| | | | 257/E21.409 |
| 2008/0268635 A1 | 10/2008 | Yu et al. | |
| 2012/0139015 A1 | 6/2012 | Yu et al. | |
| 2012/0161324 A1 | 6/2012 | Heinrich et al. | |
| 2013/0026572 A1 | 1/2013 | Kawa et al. | |
| 2013/0049219 A1 | 2/2013 | Tsai et al. | |
| 2014/0084340 A1 | 3/2014 | Wang et al. | |
| 2014/0273360 A1 | 9/2014 | Cheng et al. | |
| 2015/0102348 A1* | 4/2015 | Cai | H01L 29/66545 |
| | | | 257/69 |
| 2015/0178896 A1 | 6/2015 | Fan | |
| 2015/0187896 A1 | 7/2015 | Kamineni et al. | |
| 2015/0221740 A1* | 8/2015 | Alptekin | H01L 21/76843 |
| | | | 257/761 |
| 2015/0243653 A1 | 8/2015 | Hsiao et al. | |
| 2015/0255353 A1* | 9/2015 | Wan | H01L 21/823814 |
| | | | 257/369 |
| 2015/0380305 A1 | 12/2015 | Basker et al. | |
| 2016/0020301 A1 | 1/2016 | Park et al. | |
| 2016/0071800 A1 | 3/2016 | Hung et al. | |
| 2016/0148936 A1* | 5/2016 | Xu | H01L 29/66545 |
| | | | 257/369 |
| 2016/0225904 A1 | 8/2016 | Liao et al. | |
| 2016/0254195 A1* | 9/2016 | Jacob | H01L 21/823821 |
| | | | 438/221 |
| 2016/0284697 A1 | 9/2016 | Yoon et al. | |
| 2016/0284897 A1 | 9/2016 | Liu et al. | |

FOREIGN PATENT DOCUMENTS

| | | |
|---|---|---|
| JP | H10303309 A | 11/1998 |
| JP | 2002280568 A | 9/2002 |
| JP | 2013168569 A | 8/2013 |
| KR | 1020050087471 A | 8/2005 |

OTHER PUBLICATIONS

U.S. Appl. No. 16/576,599, filed Sep. 20, 2019.
U.S. Appl. No. 15/665,229, filed Jul. 31, 2017.
U.S. Appl. No. 14/992,997, filed Jan. 11, 2016.

* cited by examiner

INTERCONNECTION STRUCTURE, FABRICATING METHOD THEREOF, AND SEMICONDUCTOR DEVICE USING THE SAME

PRIORITY CLAIM AND CROSS-REFERENCE

This application is a continuation of U.S. patent application Ser. No. 16/576,599, filed on Sep. 19, 2019, now U.S. Pat. No. 11,049,813 issued on Jun. 29, 2021, and entitled "Interconnection Structure, Fabricating Method Thereof, and Semiconductor Device Using the Same," which application is a continuation of U.S. application Ser. No. 15/665,229, filed on Jul. 31, 2017, now U.S. Pat. No. 10,483,208 issued on Nov. 19, 2019, and entitled "Interconnection Structure, Fabricating Method Thereof, and Semiconductor Device Using the Same" which is a continuation of U.S. patent application Ser. No. 14/992,997, filed on Jan. 11, 2016, now U.S. Pat. No. 9,721,896 issued on Aug. 1, 2017, and entitled "Interconnection Structure, Fabricating Method Thereof, and Semiconductor Device Using the Same" which claims priority to U.S. Provisional Patent Application No. 62/217,774 filed Sep. 11, 2015, and entitled "Method of Manufacturing Low Resistance Metal Contact," which applications are incorporated herein by reference.

BACKGROUND

The semiconductor integrated circuit (IC) industry has experienced rapid growth. Modern integrated circuits are made up of literally millions of active devices such as transistors and capacitors. Technological advances in IC materials and design have produced generations of ICs where each generation has smaller and more complex circuits than the previous generation. These devices are initially isolated from each other, but are later interconnected together through multiple metal layers to form functional circuits. As the IC becomes increasingly more complex, the interconnect structure also becomes more complex, resulting in increasing number of metal layers.

Interconnect structures may include lateral interconnections, such as metal lines (wirings), and vertical interconnections, such as conductive vias and contacts. However, complex interconnects limit performance and the density of modern integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
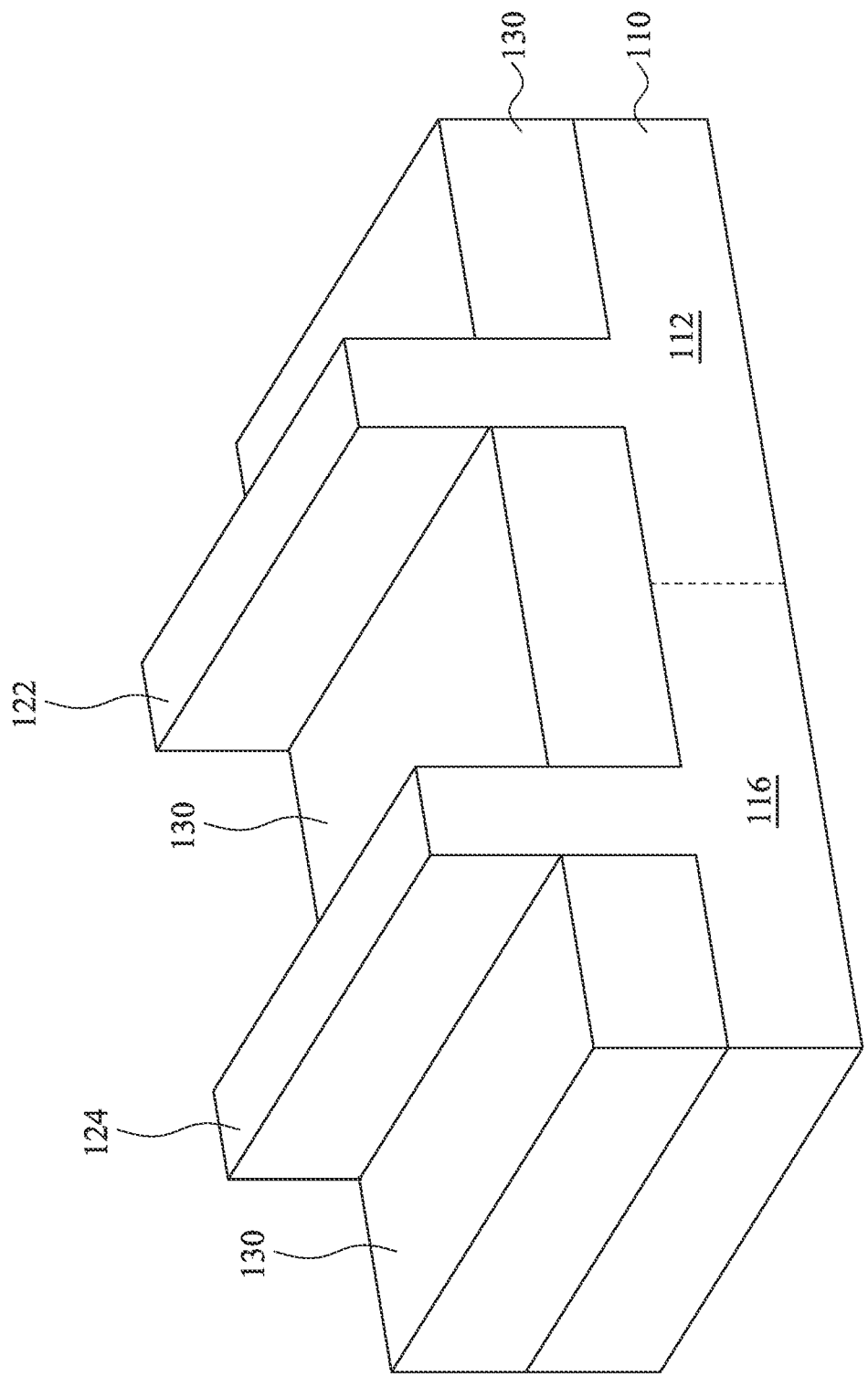
FIG. 1A to FIG. 1E are schematic oblique views of a method for manufacturing a FinFET device at various stages, in accordance with some embodiments of the present disclosure.

The following disclosure provides many different embodiments, or examples, for implementing different features of the provided subject matter. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor device sizes continue to shrink, meeting conductivity requirements as well as reliability in multiple metallization fabrication has become increasingly more difficult. For example, the formation of an interconnect structure which includes metal lines and conductive vias that interconnect metal lines from different layers of integrated circuit (IC) devices generally requires a low resistance but also a barrier layer blocking the conductive metal in the conductive vias diffusing into the ILD layer. To lower the RC delay in the IC devices, the barrier layer also plays a role in governing the resistivity of interconnects. The disclosure relates to a method of reducing resistance of interconnection structure in a semiconductor device, such as a FinFET device.

FIG. 1A to FIG. 1E are schematic oblique views of a method for manufacturing a FinFET device at various stages, in accordance with some embodiments of the present disclosure. Reference is made to FIG. 1A. A substrate 110 is provided. In some embodiments, the substrate 110 may be a semiconductor material and may include known structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

A plurality of p-well regions 116 and a plurality of n-well regions 112 are formed in the substrate 110. One of the n-well regions 112 is formed between two of the p-well regions 116. The p-well regions 116 are implanted with P dopant material, such as boron ions, and the n-well regions 112 are implanted with N dopant material such as arsenic ions. During the implantation of the p-well regions 116, the n-well regions 112 are covered with masks (such as photoresist), and during implantation of the n-well regions 112, the p-well regions 116 are covered with masks (such as photoresist).

A plurality of semiconductor fins 122, 124 are formed on the substrate 110. The semiconductor fins 122 are formed on the p-well regions 116, and the semiconductor fins 124 are formed on the n-well regions 112. In some embodiments, the semiconductor fins 122, 124 include silicon. It is noted that the number of the semiconductor fins 122, 124 in FIG. 1A is illustrative, and should not limit the claimed scope of the present disclosure. A person having ordinary skill in the art may select suitable number for the semiconductor fins 122, 124 according to actual situations.

The semiconductor fins 122, 124 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 122, 124 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

A plurality of isolation structures 130 are formed on the substrate 110. The isolation structures 130, which act as a shallow trench isolation (STI) around the semiconductor fins 122, 124 may be formed by chemical vapor deposition (CVD) techniques using tetra-ethyl-ortho-silicate (TEOS) and oxygen as a precursor. In yet some other embodiments, the isolation structures 130 are insulator layers of a SOI wafer.

Figure 1B:
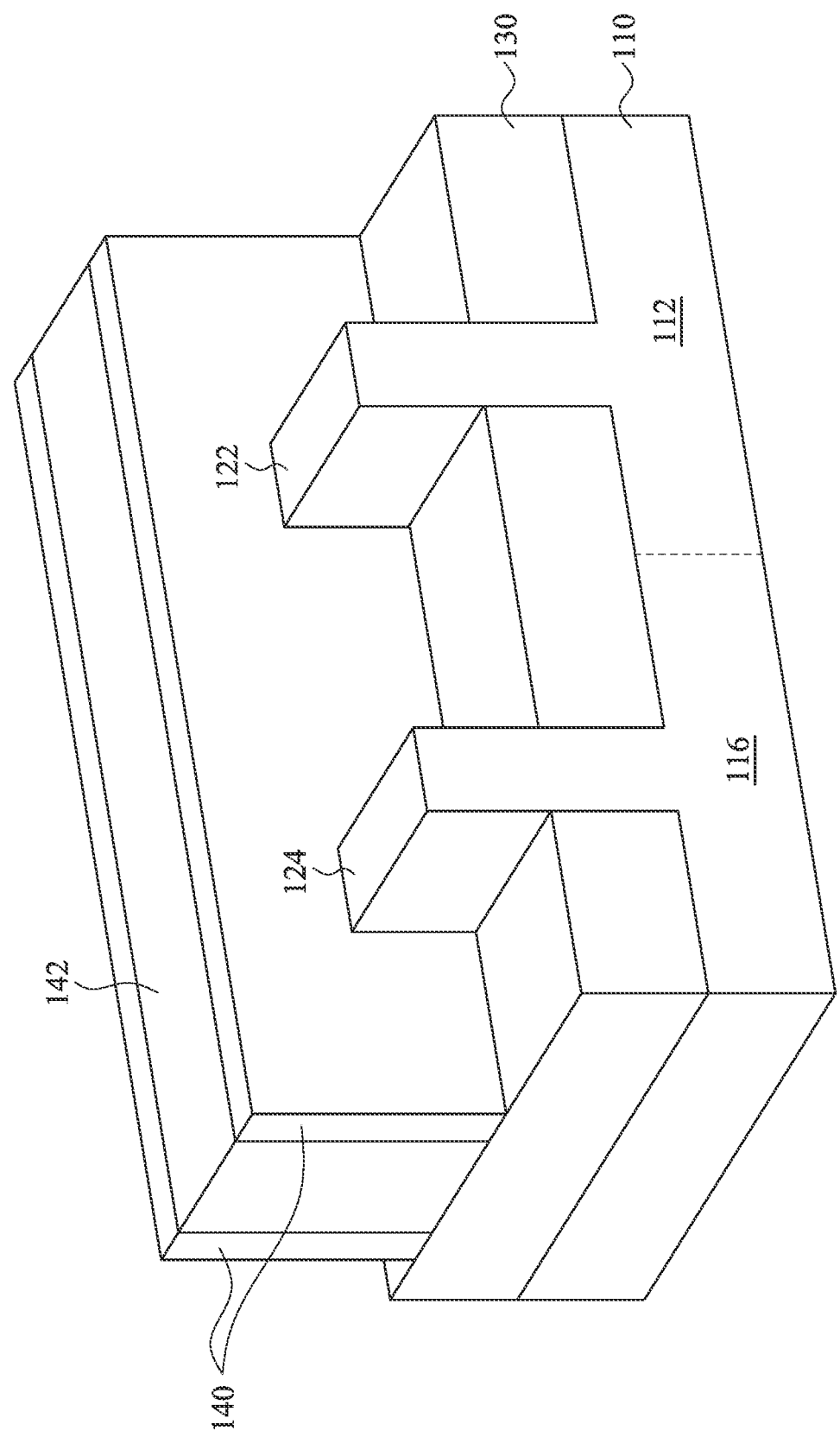

Reference is made to FIG. 1B. At least one dummy gate 142 is formed on portions of the semiconductor fins 122, 124 and exposes other portions of the semiconductor fins 122, 124. The dummy gate 142 may be formed crossing multiple semiconductor fins 122, 124.

Figure 1C:
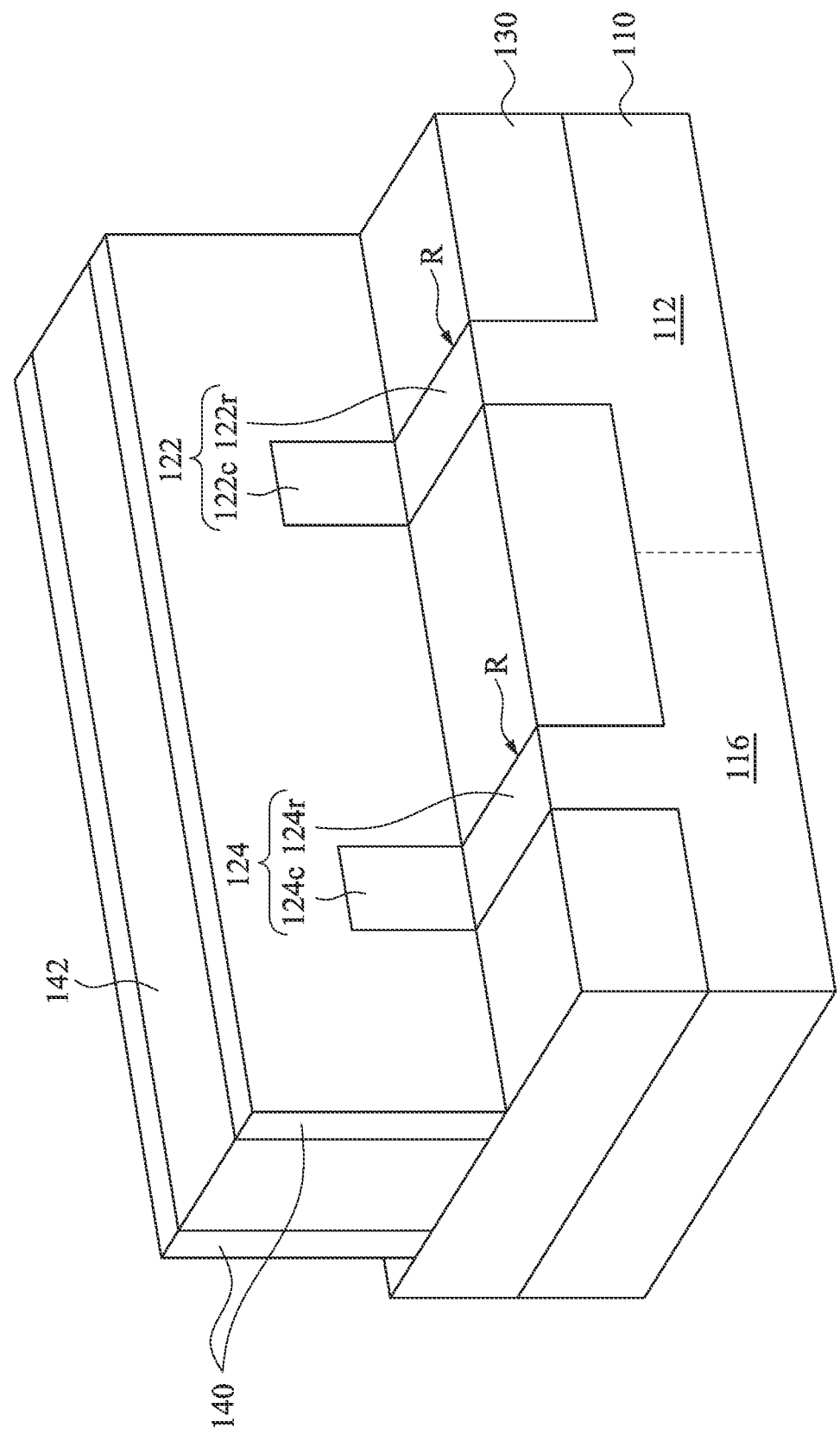

As shown in FIG. 1C, a plurality of gate spacers 140 are formed over the substrate 110 and along the side of the dummy gate 142. In some embodiments, the gate spacers 140 may include silicon oxide, silicon nitride, silicon oxynitride, or other suitable material. The gate spacers 140 may include a single layer or multilayer structure. A blanket layer of the gate spacers 140 may be formed by CVD, PVD, ALD, or other suitable technique. Then, an anisotropic etching is performed on the blanket layer to form a pair of the gate spacers 140 on two sides of the dummy gate 142. In some embodiments, the gate spacers 140 are used to offset subsequently formed doped regions, such as source/drain regions. The gate spacers 140 may further be used for designing or modifying the source/drain region (junction) profile.

Reference is made to FIG. 1C. A portion of the semiconductor fins 122, 124 exposed both by the dummy gate 142 and the gate spacers 140 are partially removed (or partially trenched) to form trenches R in the semiconductor fins 122, 124. In some embodiments, the trenches R are formed with the dielectric fin sidewall structures 125 as its upper portion. In some embodiments, sidewalls of the trenches R are substantially and vertical parallel to each other. In some other embodiments, the trenches R are formed with a non-vertical parallel profile.

In FIG. 1C, the semiconductor fin 122 includes at least one trenched portion 122r and at least one channel portion 122c. The trench R is formed on the trenched portion 122r, and the dummy gate 142 covers the channel portion 122c. The semiconductor fin 124 includes at least one trenched portion 124r and at least one channel portion 124c. The trench R is formed on the trenched portion 124r, and the dummy gate 142 covers the channel portion 124c.

The trenching process may include dry etching process, wet etching process, and/or combination thereof. The trenching process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 1D:
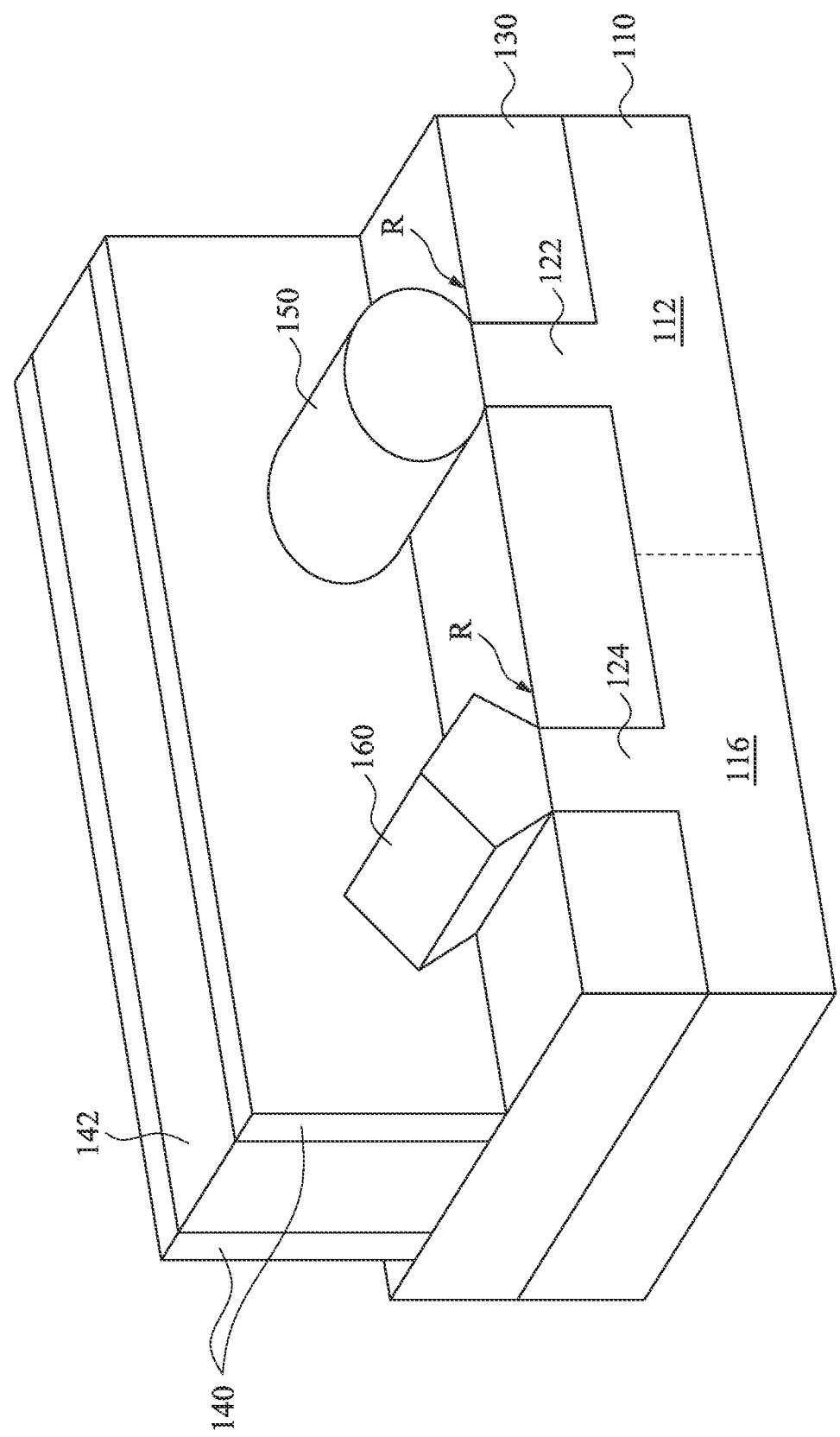

Reference is made to FIG. 1D. A plurality of epitaxy structures 160 are respectively formed in the trenches R of the semiconductor fins 124, and a plurality of epitaxy structures 150 are respectively formed in the trenches R of the semiconductor fins 122. The epitaxy structure 160 is separated from the adjacent epitaxy structure 150. The epitaxy structures 150 and 160 protrude from the trenches R. The epitaxy structures 160 can be n-type epitaxy structures, and the epitaxy structures 150 can be p-type epitaxy structures. The epitaxy structures 150 and 160 may be formed using one or more epitaxy or epitaxial (epi) processes, such that Si features, SiGe features, and/or other suitable features can be formed in a crystalline state on the semiconductor fins 122, 124. In some embodiments, lattice constants of the epitaxy structures 150 and 160 are different from lattice constants of the semiconductor fins 122, 124, and the epitaxy structures 150 and 160 are strained or stressed to enable carrier mobility of the SRAM device and enhance the device performance. The epitaxy structures 150 and 160 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, the epitaxy structures 150 and 160 are formed in different epitaxy processes. The epitaxy structures 160 may include SiP, SiC, SiPC, Si, III-V compound semiconductor materials or combinations thereof, and the epitaxy structures 150 may include SiGe, SiGeC, Ge, Si, III-V compound semiconductor materials, or combinations thereof. During the formation of the epitaxy structures 160, n-type impurities such as phosphorous or arsenic may be doped with the proceeding of the epitaxy. For example, when the epitaxy structure 160 includes SiC or Si, n-type impurities are doped. Moreover, during the formation of the epitaxy structures 150, p-type impurities such as boron or $BF_2$ may be doped with the proceeding of the epitaxy. For example, when the epitaxy structure 150 includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 122, 124 (e.g., silicon). Thus, a strained channel can be achieved to increase carrier mobility and enhance device performance. The epitaxy structures 150 and 160 may be in-situ doped. If the epitaxy structures 150 and 160 are not in-situ doped, a second implantation process (i.e., a junction implant process) is performed to dope the epitaxy structures 150 and 160. One or more annealing processes may be performed to activate the epitaxy structures 150 and 160. The annealing processes include rapid thermal annealing (RTA) and/or laser annealing processes.

In some embodiments, the epitaxy structure 150 has a top portion and a body portion disposed between the top portion and the substrate 110. The width of the top portion is wider than a width of the body portion. The epitaxy structure 160 has a top portion and a body portion disposed between the top portion and the substrate 110. A width of the top portion is wider than a width of body portion. The epitaxy structures 150 and 160 are utilized as source/drain electrodes of the FinFET device 100.

In some embodiments, the epitaxy structures 150 and 160 have different shapes. The top portions of the epitaxy structures 160 can have at least one substantially facet surface present above the isolation structures 130, and the top portions of the epitaxy structures 150 can have at least one non-facet (or round) surface present above the isolation structures 130, and the claimed scope is not limited in this respect.

Figure 1E:
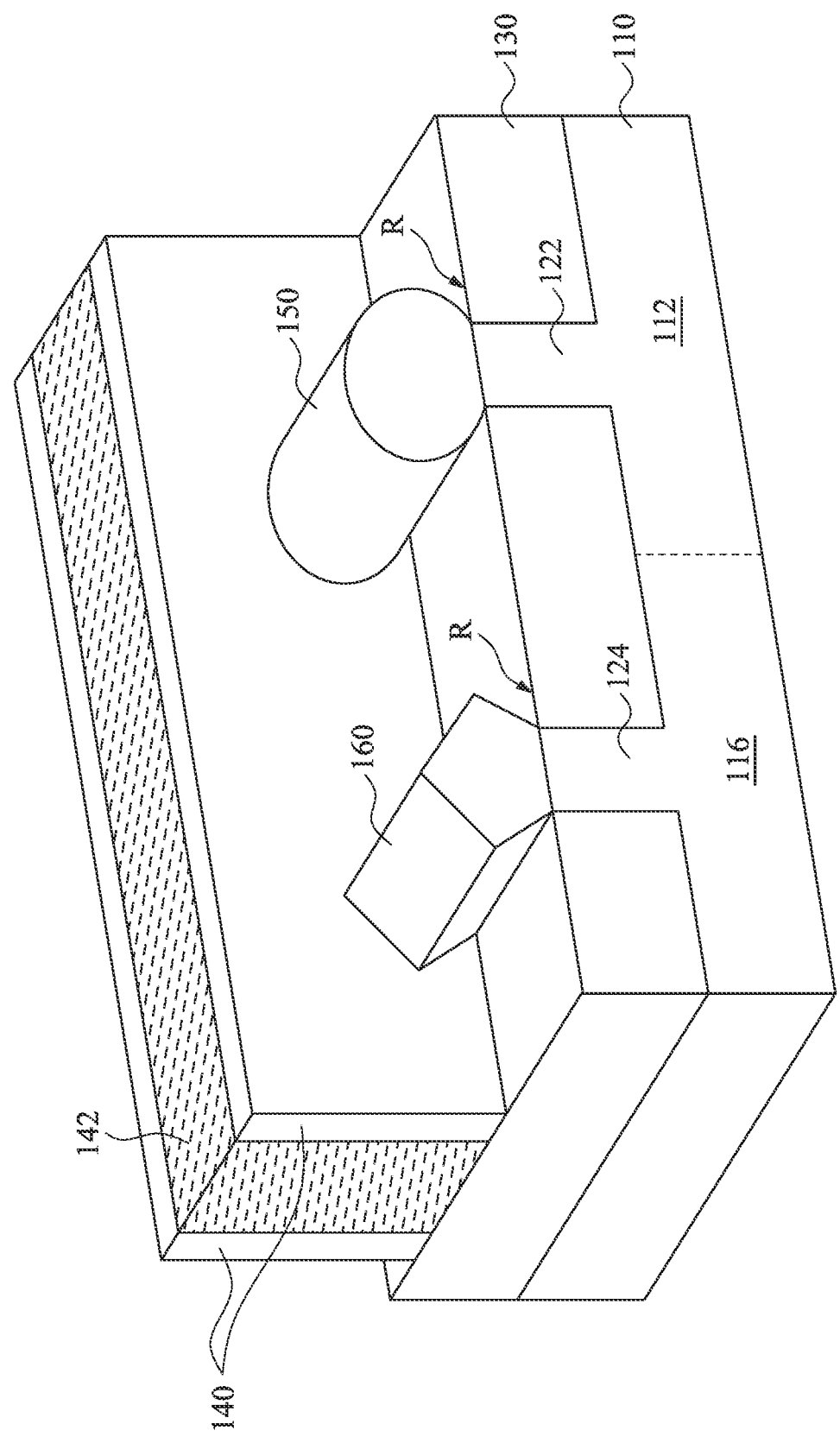

Reference is made to FIG. 1E. After the epitaxy structures 150 and 160 are formed, the dummy gate 142 is removed, thus a trench is formed between the gate spacer 140. The isolation structure 130 and a portion of the semiconductor fins 122, 124 are exposed from the trench. The dummy gate 142 can be removed by performing one or more etching processes. A gate stack 170 is formed and fills the trench. The gate stack 170 includes a gate electrode and a gate dielectric disposed between the gate electrode and the isolation structures 130. The gate dielectric and the gate electrode can be respectively formed by a deposition process, such as an ALD process, a CVD process, a PVD process or a sputter deposition process. The gate dielectric is made of dielectric material such as, silicon nitride, silicon oxynitride, dielectric with a high dielectric constant (high-k), and/or combinations thereof. In some embodiments, the gate electrode is a metal electrode. In some embodiments, the gate stack 170 further includes a cap layer on the gate electrode.

After the FinFET device 100 is fabricated, an interconnection structure is formed for interconnecting the electrodes of the FinFET device to other devices. Details of fabricating the interconnection structure are discussed in FIG. 2A to FIG. 2G, in which FIG. 2A to FIG. 2G are local cross-sectional views of a method of fabricating interconnection structure in a FinFET device.

Figure 2A:
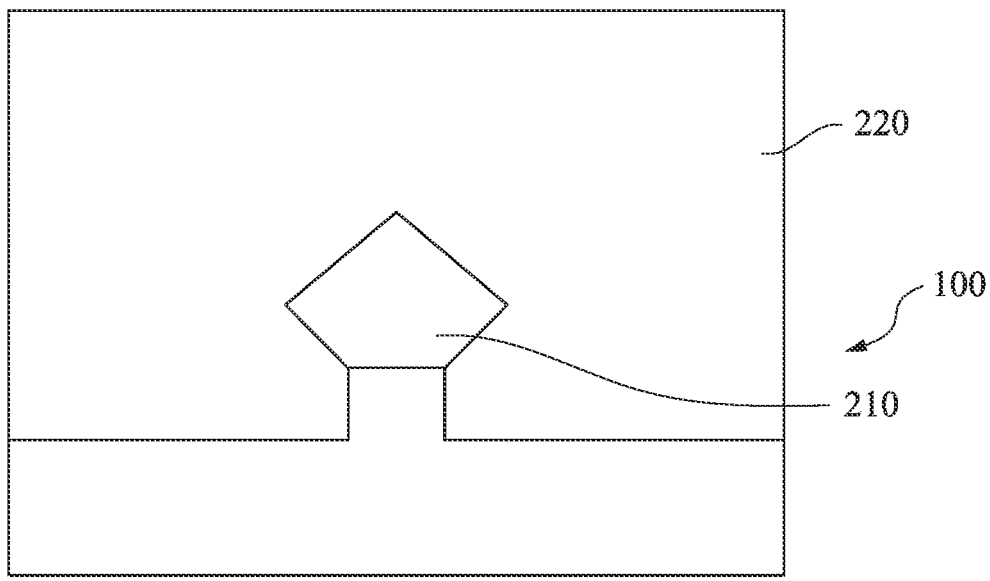
FIG. 2A to FIG. 2G are local cross-sectional views of a method of fabricating interconnection structure in a FinFET device.

Reference is made to FIG. 2A. A dielectric layer 220 is formed on the FinFET device 100. The dielectric layer 220 covers the epitaxy structure 210 and the isolation structure around the epitaxy structure 210. The epitaxy structure 210 can be any one of the epitaxy structures 150 and 160 as discussed in FIG. 1D. The dielectric layer 220 may be an interlayer dielectric (ILD) and may contain an oxide material or a low-k material. The dielectric layer 220 may be formed by, for example, a chemical vapor deposition (CVD) processing step, a spin-on processing step, or combination thereof. The dielectric layer 220 is provided to isolate conductive features formed on different and/or the same layers.

Figure 2B:
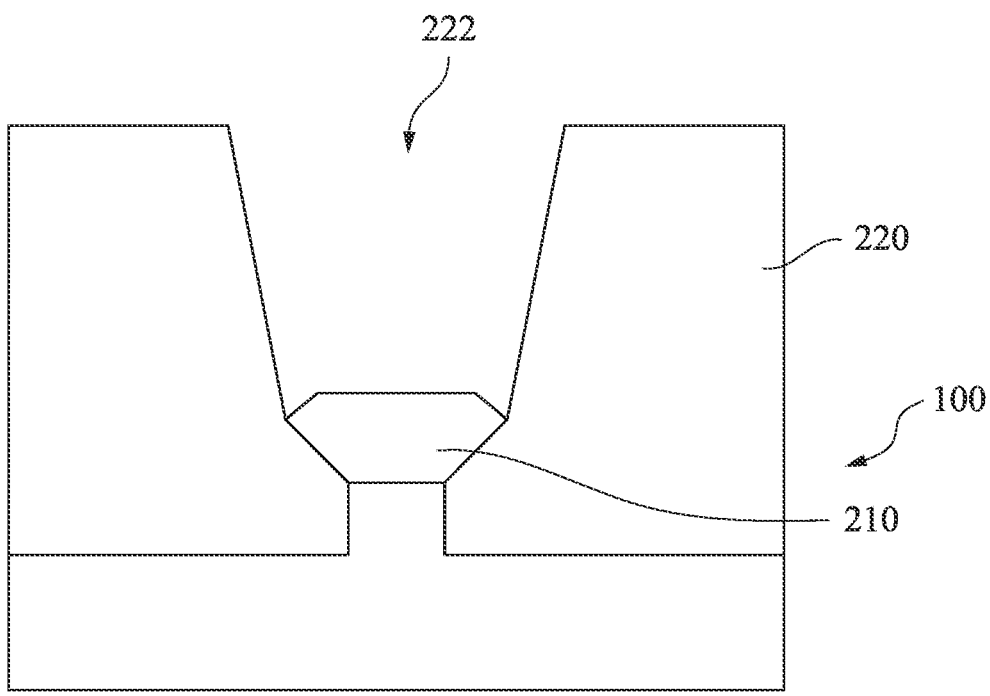

Reference is made to FIG. 2B. An opening 222 is formed in the dielectric layer 220. In some embodiments, there is a plurality of the openings formed in the dielectric layer 220. The opening 222 may be, for example, contact openings, via openings, single damascene openings, dual damascene openings, or combinations thereof. The opening 222 may be formed, for example, by forming a patterned photoresist layer (not shown) over the dielectric layer 220 and using a dry etch processing step to remove portions of the dielectric layer 220 to define the opening 222 by using the patterned photoresist layer (not shown) as a mask. Various suitable dry etch processes may be used. After the dry etch processing step, the patterned photoresist layer (not shown) is removed by, for example, a photolithographic removal process. Some of the epitaxy structure 210 are also removed during forming the opening 222.

A portion of the epitaxy structure 210 is exposed from the opening 222. An oxide removal process is selectively performed to remove the oxide layer present on the exposed epitaxy structure 210 after the opening 222 is formed.

Figure 2C:
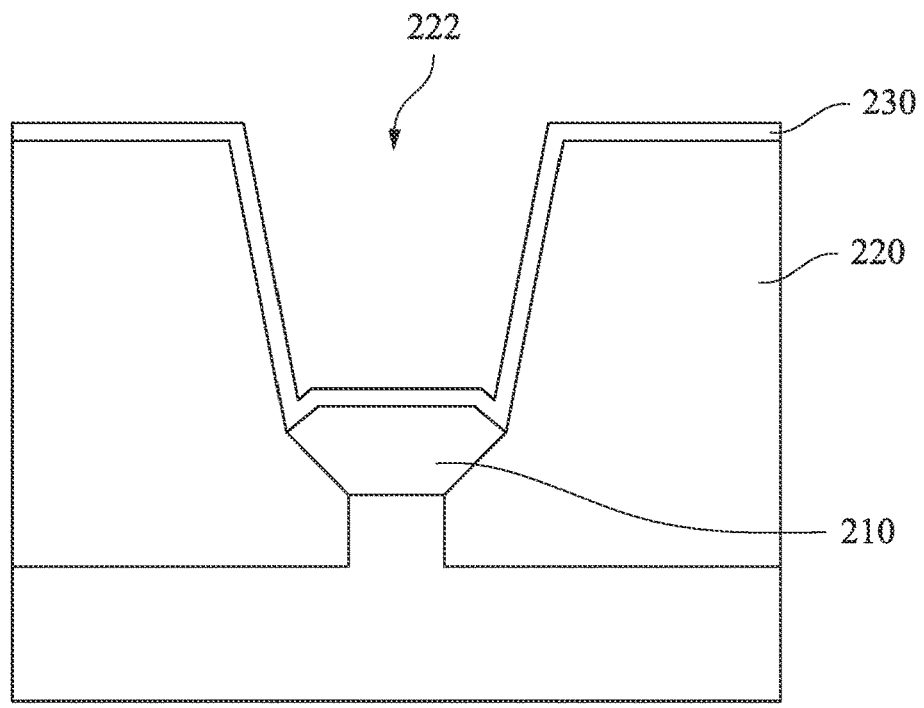

Reference is made to FIG. 2C. A metal layer 230 is formed to line the sidewalls and bottoms of the opening 222 and over the dielectric layer 220. In some embodiments, the metal layer 230 can be a metal alloy layer. The metal layer 230 includes metal for use in self-aligned silicide (salicide) technology, such as titanium (Ti), cobalt (Co), nickel (Ni), platinum (Pt), or tungsten (W). The metal layer 230 is formed by a deposition process, such as a CVD process, a PVD process or a sputter deposition process.

Figure 2D:
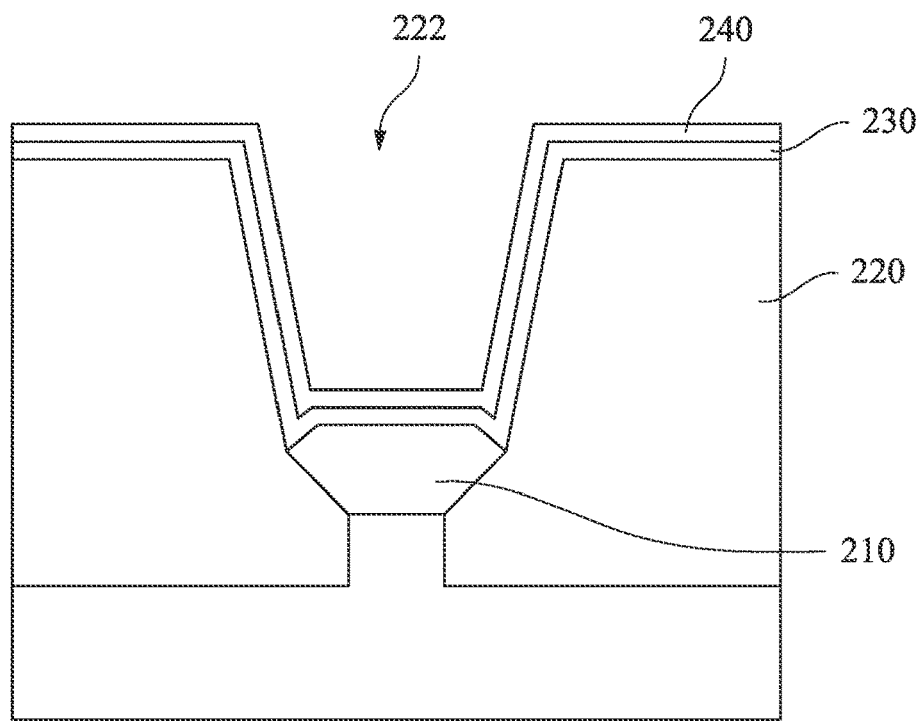

Reference is made to FIG. 2D. A barrier layer 240 is formed on the metal layer 230. The barrier layer 240 may function as a barrier to prevent a subsequently formed conductor from diffusing into the underlying dielectric layer 220. In some embodiments, the barrier layer 240 includes tantalum (Ta), titanium (Ti) or the like. In some embodiments, the barrier layer 240 has a thickness of about 10 angstrom to about 250 angstroms. In some embodiments, a combined thickness of the metal layer 230 and the barrier layer 240 is less than about 120 angstroms to prevent a gap filling issue during the subsequent opening filling process. The barrier layer 240 is deposited by using PVD, CVD, PECVD, LPCVD, or other well-known deposition techniques.

Figure 2E:
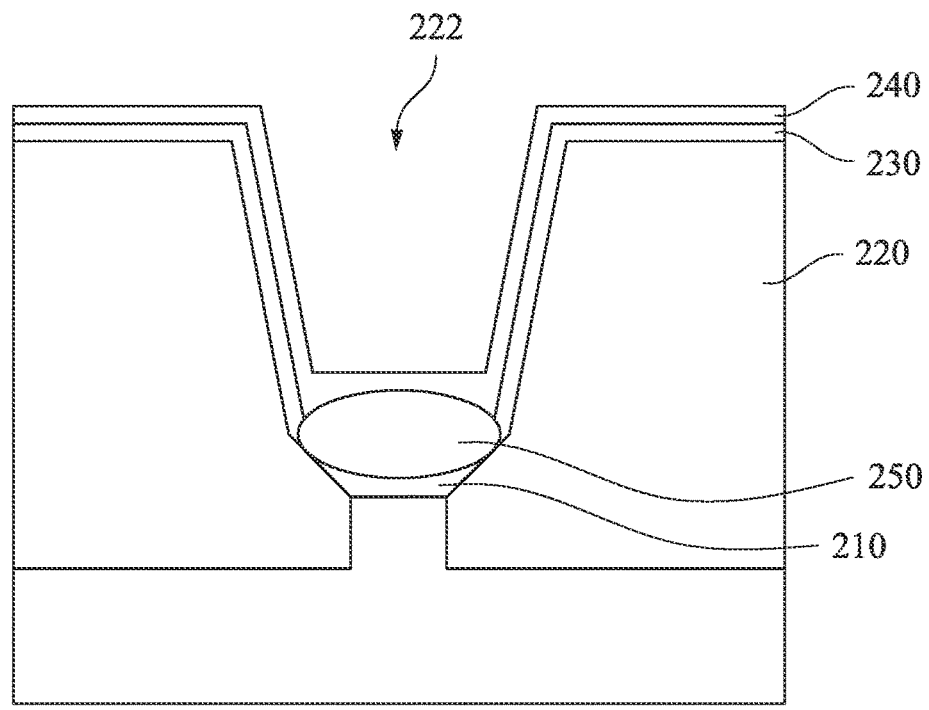

Reference is made to FIG. 2E. An anneal process is performed to form a silicide 250 on the epitaxy structure 210. Annealing process is utilized to convert the amorphous silicide to a lower-resistance polycrystalline phase. The salicide process is sometimes used to form silicide contacts to the source and drain region to solve the problem of critical dimension tolerance. In some embodiments, the metal layer is a titanium layer and is annealed to become a titanium silicide 250. The anneal process is performed to form Ti rich phase, and the thickness of the titanium silicide is in a range from 30 angstroms to 160 angstroms. In some embodiments, the titanium silicide 250 can be $TiSi_2$ since the epitaxy structure 210 is an n-type epitaxy structure. In some embodiments, the titanium silicide 250 can be TiSiGe since the epitaxy structure 210 is a p-type epitaxy structure.

Using n-type source or drain region as an example, when titanium and silicon are brought into contact and heated at temperatures above 500° C., the higher-resistivity $C49\text{-}TiSi_2$ phase transfers to the low-resistivity $C54\text{-}TiSi_2$ phase. The C49-TiSi$_2$ phase has an orthorhombic base-centered structure with 12 atoms per unit cell and a resistivity of 60-90 μΩ-cm. The C54-TiSi$_2$ phase has an orthorhombic face-centered structure having 24 atoms per unit cell and a significantly lower resistivity (12-20 μΩ-cm) than the C49-TiSi$_2$ phase.

The annealing process is performed in an annealing temperature less than 700° C. and in an annealing duration less than 120 seconds. As a result, the Si concentration (for n-type source or drain region) or the Si and Ge concentrations (for p-type source or drain region) are decreased with the increasing silicide height since only the top of the epitaxy structure 210 diffuses into the metal layer 230. Namely, the Si concentration or the Si and Ge concentrations at the top (e.g. away from the epitaxy structure 210) of the titanium silicide 250 is less than that at the bottom (e.g. close to the epitaxy structure 210) of the titanium silicide 250. The Si concentration or the Si and Ge concentrations of the silicide 250 at the interface between the silicide 250 and the barrier layer 240 is less than that at the interface between the silicide 250 and the epitaxy structure 210.

Figure 2F:
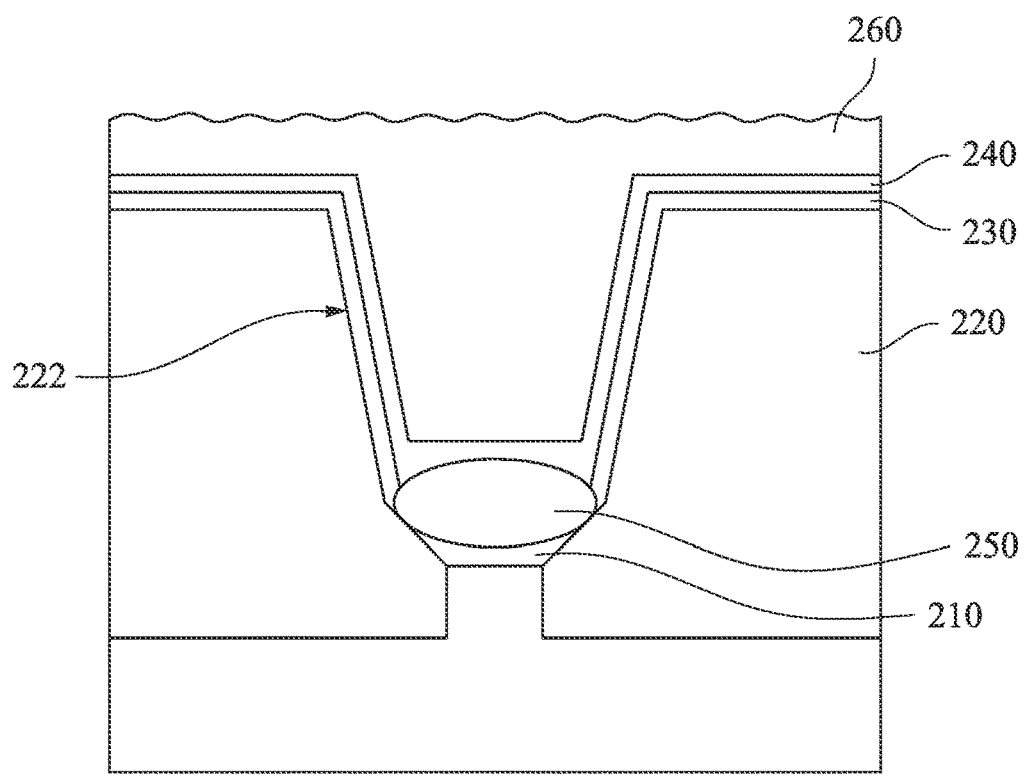

Reference is made to FIG. 2F. A conductor 260 is formed over the barrier layer 240 to fill the opening 222. In some embodiments, the conductor 260 is formed as an interconnect structure in the dielectric layer 220. In some embodiments, the conductor 260 is formed by a deposition process, such as a CVD process, a PVD process or a sputter deposition process. In some embodiments, the conductor 260 includes tungsten (W) or copper (Cu).

The bottom of the metal layer 230 is reacted with the epitaxy structure 210 and becomes the silicide 250. Therefore, the remaining metal layer 230 is present between the barrier layer 240 and the sidewall of the opening 222 and is not present between the silicide 250 and the barrier layer 240. Namely, the bottom of the barrier layer 240 is directly in contact with the silicide 250, such that the contact resistance of the interconnection structure is reduced.

Figure 2G:
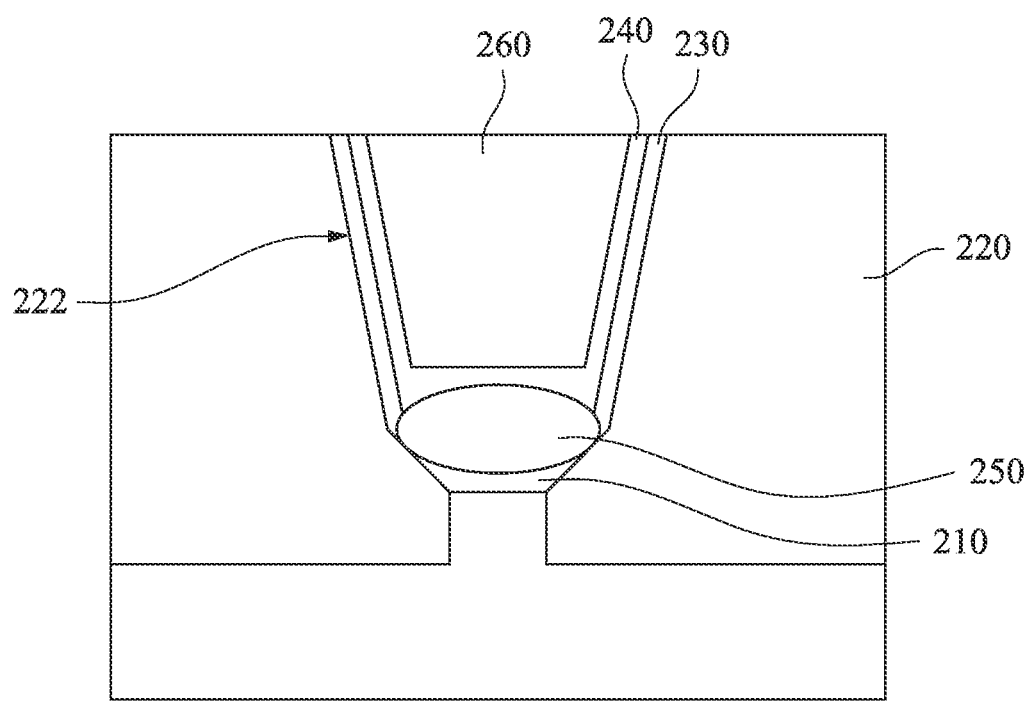

Reference is made to FIG. 2G. The portion of conductor 260 over the dielectric layer 220 is removed. In some embodiments, the removing process is chemical mechanical polishing (CMP) process performed to remove the excess portions of the conductor 260, the barrier layer 240, and the metal layer 230 outside the opening 222, thus exposing the top surface of the dielectric layer 220 and achieving a planarized surface.

The aforementioned interconnection structure is not limited to be utilized in FinFET device with epitaxy structure, but can be utilized to any suitable semiconductor device with silicide contact. For example, the aforementioned interconnection structure can be utilized for example, a nanowire component, as discussed in FIG. 3A to FIG. 3F.

Figure 3A:
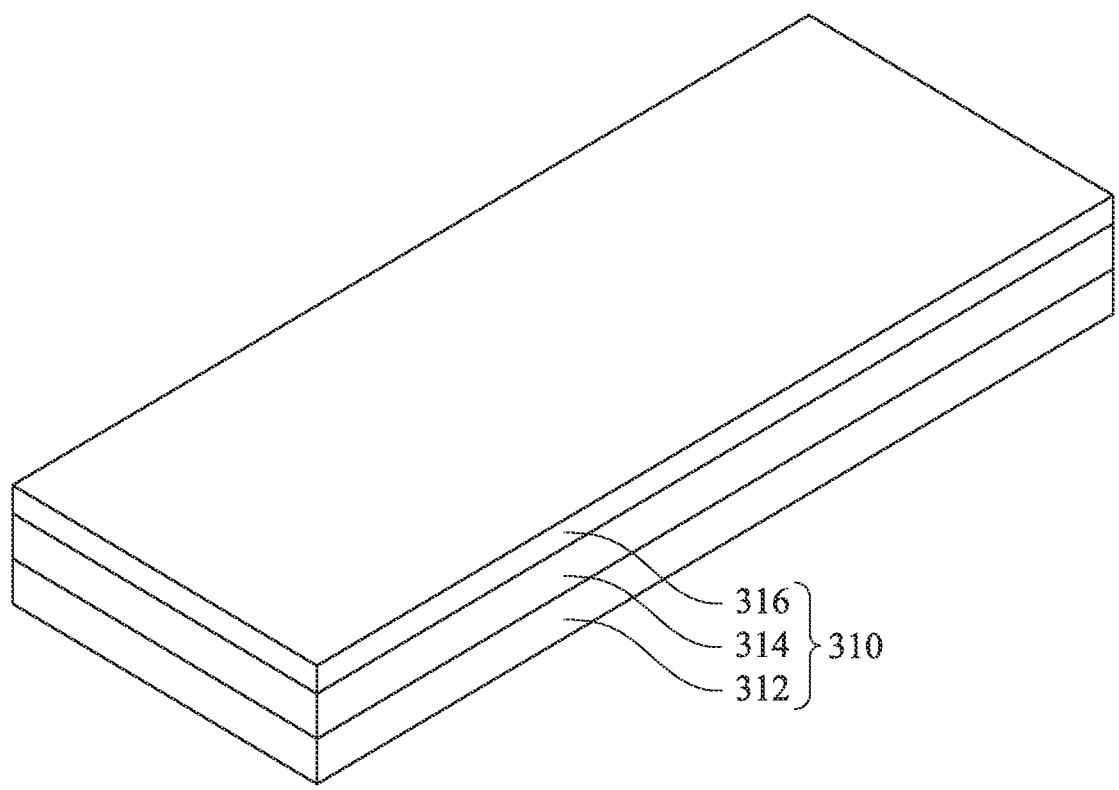
FIG. 3A to FIG. 3F are schematic oblique views of a method for manufacturing a semiconductor device at various stages, in accordance with some embodiments of the present disclosure.

Reference is made to FIG. 3A to FIG. 3F. FIG. 3A to FIG. 3F are schematic oblique views of a method for manufacturing a semiconductor device at various stages, in accordance with some embodiments of the present disclosure. Referring to FIG. 3A, the method begins with a semiconductor-on-insulator (SOI) structure 310. The SOI structure 310 includes a semiconductor substrate 312, a buried oxide (BOX) layer 314 and an SOI layer 316. In some embodiments, the SOI layer 316 is formed from a semiconductor material, such as silicon. The BOX layer 314 may include silicon oxide, silicon nitride or silicon oxynitride. The BOX layer 314 is present between the semiconductor substrate 312 and the SOI layer 316. In a greater detail, the BOX layer 314 may be present underlying the SOI layer 316 and at top of the semiconductor substrate 312, and the BOX layer 314 may be formed by implanting a high-energy dopant into the SOI structure 310 and then annealing the structure to form a buried oxide layer. In some other embodiments, the BOX layer 314 may be deposited or grown prior to the formation of the SOI layer 316. In yet some other embodiments, the SOI structure 310 may be formed using wafer-bonding techniques, where a bonded wafer pair is formed utilizing glue, adhesive polymer, or direct bonding.

Figure 3B:
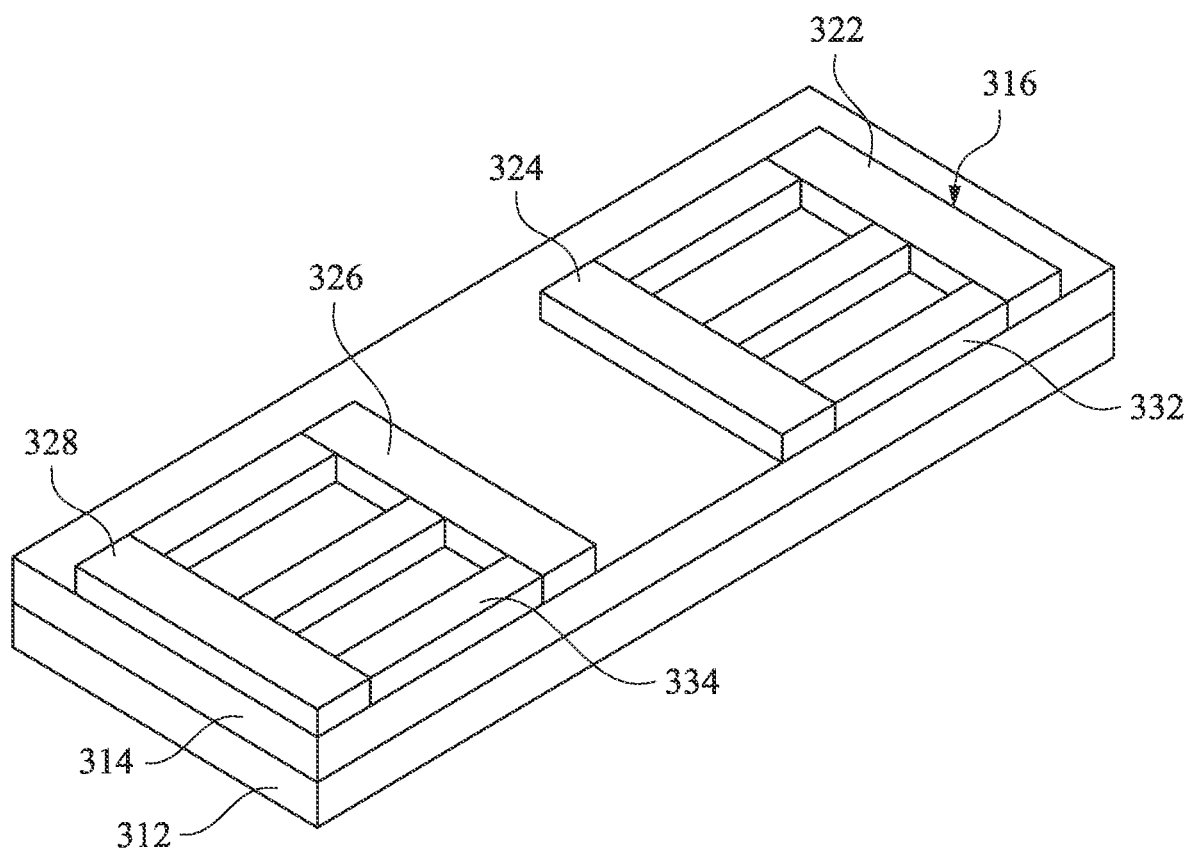

Reference is made to FIG. 3B. The SOI layer 316 is patterned to form pads 322, 324, 326 and 328 and connecting structures 332 and 334. For example, the pads 322, 324, 326 and 328 and the connecting structures 332 and 334 may be fabricated by using suitable processes such as photolithography and etching. The connecting structures 332 connect the pads 322 and 324. The connecting structures 334 connect the pads 326 and 328. In other words, at least one of the connecting structures 332 may have separate pads 322 and 324 on opposite sides thereof, and at least one of the connecting structures 334 may have separate pads 326 and 328 on the opposite sides thereof.

Figure 3C:
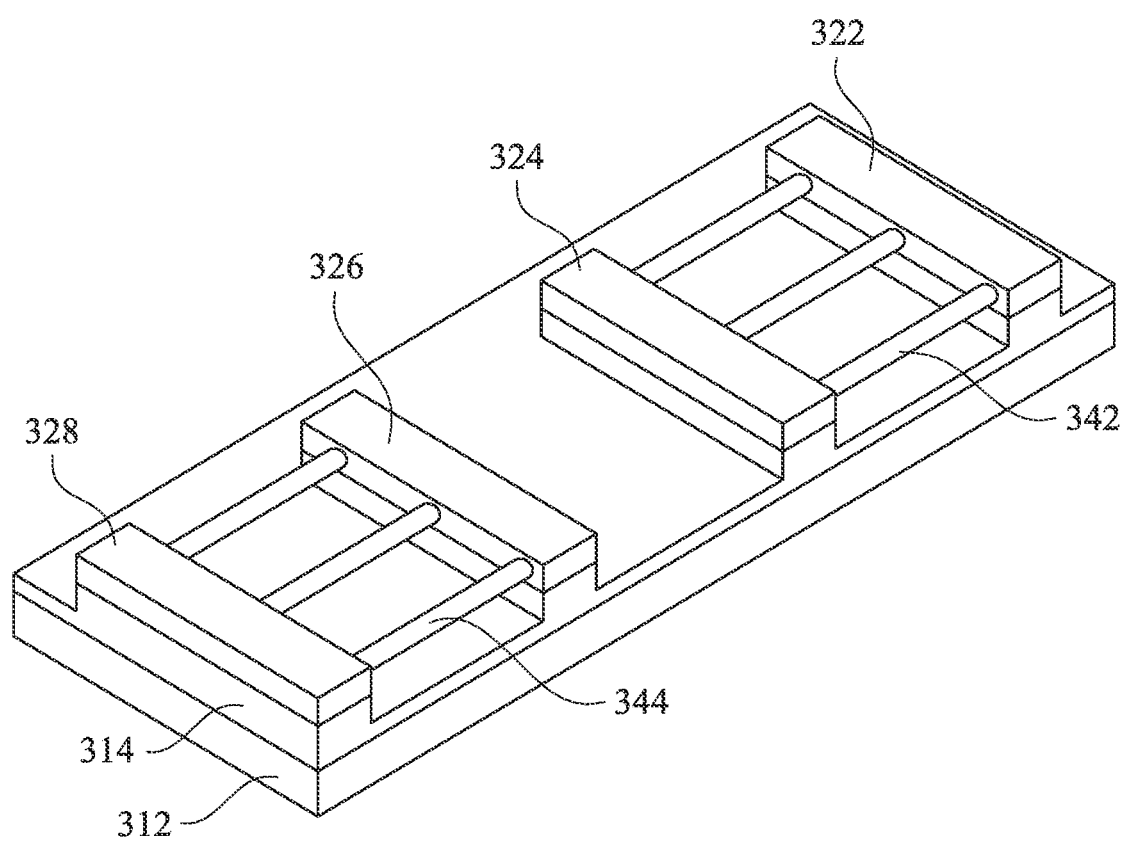

Reference is made to FIG. 3C. The connecting structures 332 and 334 are partially removed to form first nanowires 342 and second nanowires 344. In some embodiments, lower portions of the connecting structures 332 and 334 and underlying portions of the BOX layer 314 are removed by an isotropic etching process, so that the first nanowires 342 are formed as suspended between the pads 322 and 324, and the second nanowires 344 are formed as suspended between the pads 326 and 328. The isotropic etching is a form of etching that does not include a preferential direction. One example of an isotropic etching is wet etching. The isotropic etching process forms undercut regions that the first and second nanowires 342 and 344 are suspended over. In some embodiments, the isotropic etching may be performed using a diluted hydrofluoric acid (DHF). After the isotropic etching process, the first and second nanowires 342 and 344 may be smoothed to form elliptical shaped (and in some cases, cylindrical shaped) structures. In some embodiments, the smoothing process may be performed by an annealing process. Example annealing temperature may range from about 600° C. to about 1000° C., and the hydrogen pressure in the annealing process may range from about 7 torr to about 600 torr.

Figure 3D:
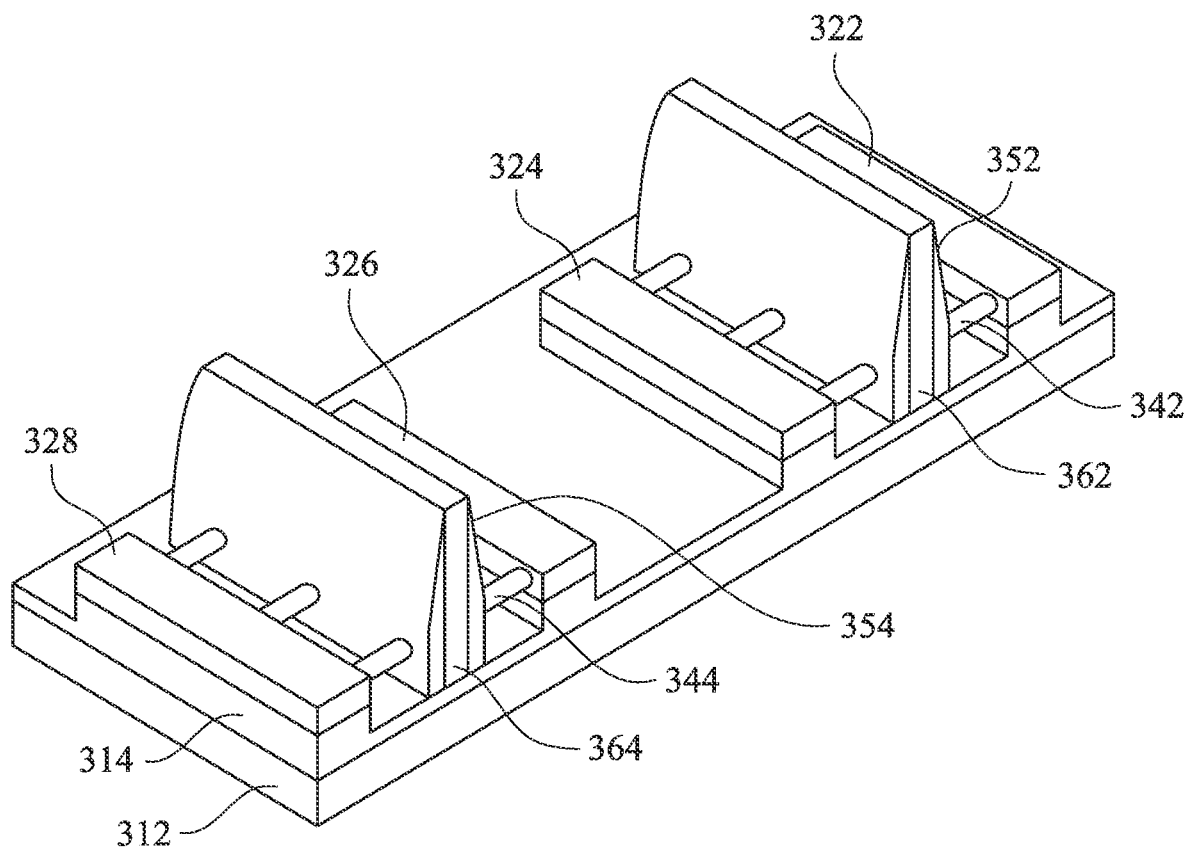

Reference is made to FIG. 3D. Dummy gate material layer 362 is formed crossing the first nanowires 342, and the dummy gate material layer 364 is formed crossing the second nanowires 344. Spacers 352 are formed on opposite sidewalls of the dummy gate material layer 362, and spacers 354 are formed on opposite sidewalls of the dummy gate material layer 364. The dummy gate material layers 362 and 364 can be polysilicon. The method of forming the spacers 352 and 354 includes forming a dielectric layer and then performing an etching process to remove a portion of the dielectric layer.

Following the formation of the spacers 352 and 354, an n-type dopant may be introduced to the exposed portions of the first nanowires 342 that are adjacent to the spacers 352, so as to form n-type source/drain extension regions. Similarly, a p-type dopant may be introduced to the exposed portions of the second nanowires 344 that are adjacent to the spacers 354, so as to form p-type source/drain extension regions. An Example of the p-type dopant includes, but is not limited to, boron, aluminum, gallium and indium. An example of the n-type dopant includes, but is not limited to, antimony, arsenic and phosphorous.

In some embodiments, source/drain extension regions are formed in the first nanowires 342 and the second nanowires 344 using an in-situ doped epitaxial growth process followed by an annealing process to drive the dopant from the in-situ doped epitaxial semiconductor material into the first nanowires 342 and the second nanowires 344 to provide the extension regions. In some embodiments, the in-situ doped semiconductor material is formed using an epitaxial growth process. "In-situ doped" means that the dopant is incorporated into the in-situ doped semiconductor material during the epitaxial growth process that deposits the semiconductor containing material of the in-situ doped semiconductor material. When the chemical reactants are controlled, the depositing atoms arrive at the surface of the first and sheathed nanowires 342 and 344 and the pads 322, 324, 326 and 328 with sufficient energy to move around on the surface and orient themselves to the crystal arrangement of the atoms of the deposition surface. The epitaxial growth thickens the pads 322, 324, 326 and 328 and portions of the first nanowires 342 and the second nanowires 344 that are not covered by the dummy gate material layers 362 and 364, and the spacers 352 and 354.

Thereafter, ion implantation may be performed to the pads 322, 324, 326 and 328 to form deep source/drain regions. The deep source/drain regions may be formed using ion implantation. During the ion implant that provides the deep source/drain regions, the portions of the device in which the implant is not desirable may be protected by a mask, such as a photoresist mask. The deep source/drain regions in the pads 322 and 324 have the same conductivity dopant as the source/drain extension regions in the first nanowires 342, such as the n-type dopant, but the deep source/drain regions in the pads 322 and 324 have a greater dopant concentration then the source/drain extension regions in the first nanowires 342. Similarly, the deep source/drain regions in the pads 326 and 328 have the same conductivity dopant as the source/drain extension regions in the second nanowires 344, such as the p-type dopant, but the deep source/drain regions in the pads 326 and 328 have a greater dopant concentration then the source/drain extension regions in the second nanowires 344.

Figure 3E:
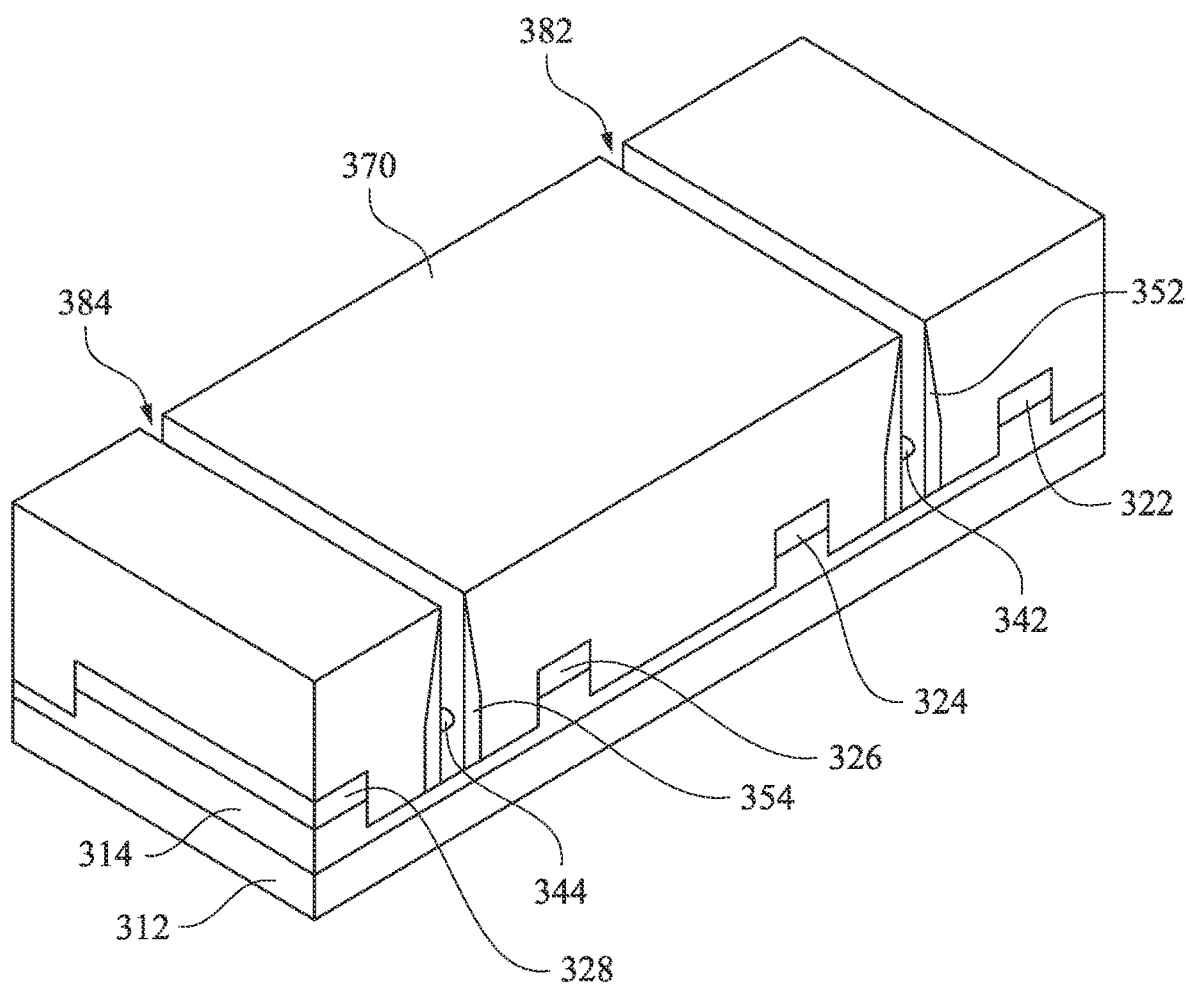

Reference is made to FIG. 3E. An interlayer dielectric (ILD) layer 370 is formed to cover the dummy gate material layers, the first nanowires 342 and the second nanowires 344. The ILD layer 370 may include silicon oxide, silicon nitride, silicon oxynitride, silicon carbide, a low-dielectric constant dielectric material, or combinations thereof. The ILD layer 370 can be formed by a deposition process, such as a CVD process. Afterwards, a portion of the ILD layer 370 is removed to expose top surfaces of the dummy gate material layers. The removing step may include performing a chemical-mechanical polishing (CMP) process. The dummy gate material layers are further removed by using suitable processes, such as wet etching. After removal of the dummy gate material layers, a first trench 382 is formed between the spacers 352, and a second trench 384 is formed between the spacers 354, and the first and second trenches 382 and 384 are spatially isolated from each other by the spacers 352, 354 and the ILD layer 370.

Figure 3F:
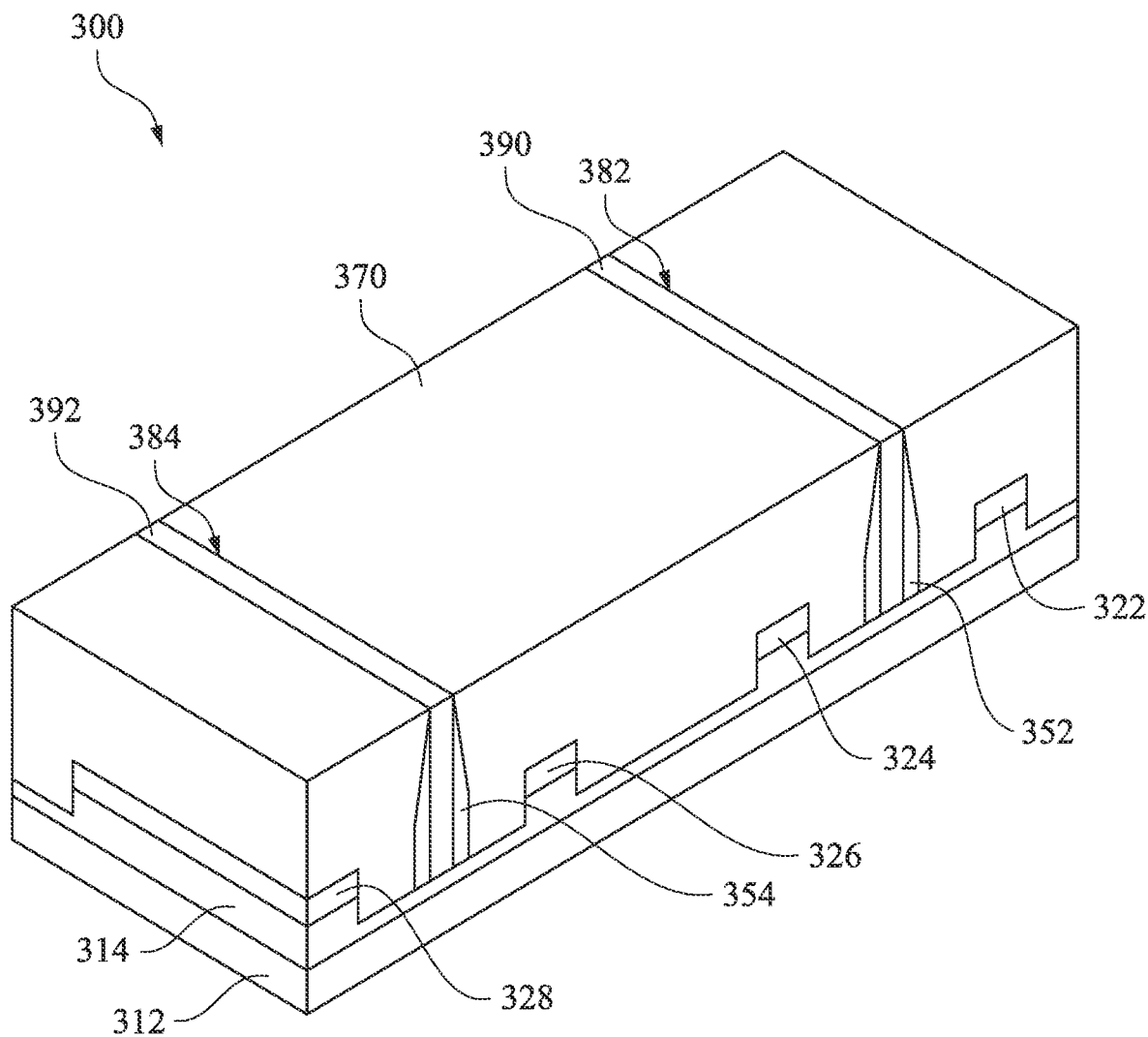

Reference is made to FIG. 3F. Gate stacks 390 and 392 are formed and fill the trenches 382 and 384. The gate stacks 390 and 392 respectively include a gate dielectric wrapping the nanowires, a gate electrode wrapping the gate dielectric, and a cap layer wrapping the gate electrode.

After the semiconductor device 300 is formed, a plurality of interconnection structures are formed in the ILD layer 370 to connect to the pads 322, 324, 326 and 328. A cross-sectional view of the interconnection structure and the pads is illustrated in FIG. 4.

Figure 4:
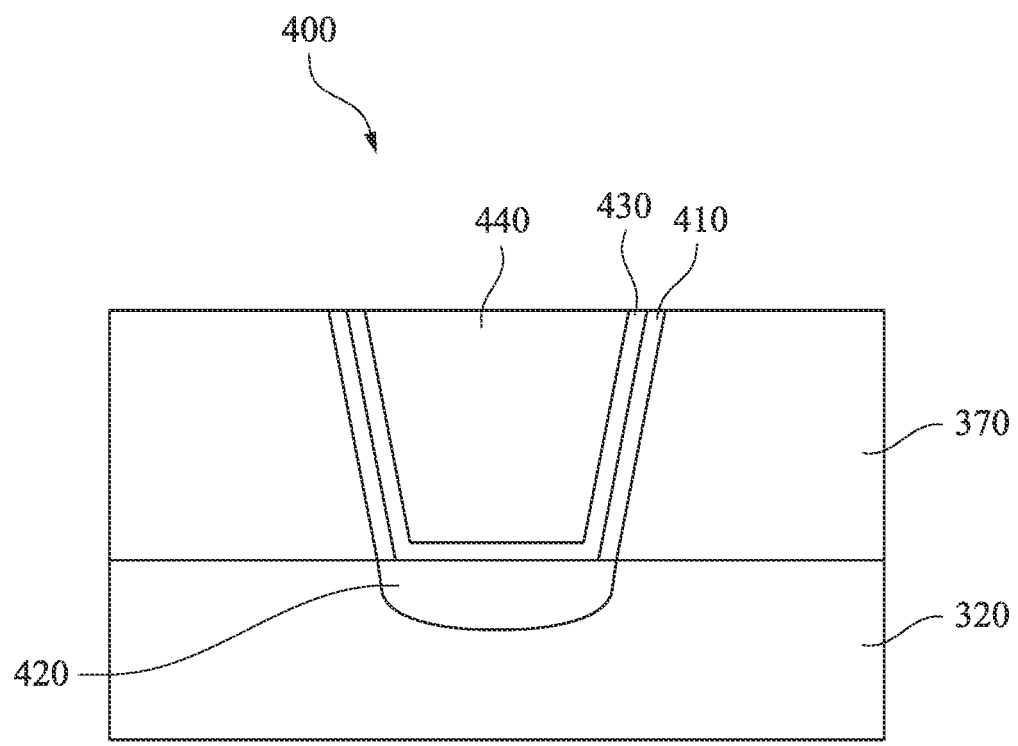
FIG. 4 is a local cross-sectional view of an interconnection structure, in accordance with some other embodiments of the disclosure.

As shown in FIG. 4, an interconnection structure 400 is formed in the ILD layer 370 and is in contact with the pad 320. The pad 320 can be any one of the pad 322, 324, 326 and 328, as shown in FIG. 3F. The interconnection structure 400 includes a metal layer 410, a silicide 420, a barrier layer 430, and a conductor 440. Details of fabricating the interconnection structure 400 are substantially the same as the method described in FIG. 2A to FIG. 2G. The metal layer 410 is deposited in an opening of the ILD layer 370, and the bottom of the metal layer is reacted with the pad 320 and becomes silicide 420. The metal layer 410 is present between the barrier layer 430 and the sidewall of the ILD layer 370 and is not present between the barrier layer 430 and the silicide 420. The barrier layer 430 is directly in contact with the silicide 420. The conductor 440 is formed filling the opening.

The annealing process of salicide is performed after the metal layer and the barrier layer are deposited. The bottom of the metal layer contacts and reacts with the source or drain region and becomes the metal silicide during the annealing process. As a result, the metal layer is present between the barrier layer and the sidewall of the opening and is not present between the barrier layer and the silicide. The barrier layer is directly in contact with the silicide thereby reducing the contact resistance of the interconnection structure.

According to some embodiments of the disclosure, a semiconductor device includes a semiconductor substrate comprising a contact region, a silicide present on the contact region, a dielectric layer present on the semiconductor substrate, the dielectric layer comprising an opening to expose a portion of the contact region, a conductor present in the opening, a barrier layer present between the conductor and the dielectric layer, and a metal layer present between the barrier layer and the dielectric layer, wherein a Si concentration of the silicide is varied along a height of the silicide.

According to some embodiments of the disclosure, an interconnection structure includes a silicide, a conductor, a barrier layer present between the silicide and the conductor, and a metal layer present at sidewalls of the barrier layer, wherein a Si concentration of the silicide is decreased along a height of the silicide.

According to some embodiments of the disclosure, a method of fabricating an interconnection structure includes forming an opening in a dielectric layer to expose a portion of a contact region; forming a metal layer on a sidewall of the opening and on the contact region; forming a barrier layer on the metal layer; and performing an annealing process after the barrier layer formed on the metal layer to form a silicide between the barrier layer and the contact region.

One general aspect of embodiments disclosed herein includes a device including: a multi-gate transistor, the multi-gate transistor including an epitaxial source/drain region; a dielectric layer overlying the epitaxial source/drain region; a contact extending through an opening in the dielectric layer and electrically contacting the epitaxial source/drain region, the contact including: a silicide layer contacting the epitaxial source/drain region; a barrier layer contacting the silicide layer; a metal layer contacting the barrier layer and contacting sidewalls of the opening in the dielectric layer; and a conductor contacting the barrier layer.

Another general aspect includes a device including: a channel region; a gate conductor wrapped around the channel region; a source/drain region on one side of the channel region; a dielectric layer over the source/drain region, the dielectric layer having an opening therein aligned to the source/drain region; a portion of the source/drain region forming a silicide layer in the opening, the silicide having a silicon concentration that varies from a top of the silicide layer to a bottom of the silicide layer; a metal layer lining sidewalls of the opening; a barrier layer on the metal layer; and a conductor on the barrier layer and filling the opening.

Yet another general aspect of embodiments disclosed herein includes a method including: forming a multi-gate transistor structure on a substrate; covering the multi-gate transistor structure with a dielectric layer; forming an opening in the dielectric layer, the opening exposing a source/drain region of the multi-gate transistor structure, where forming an opening removes a top portion of the source/drain; lining the opening with a metal layer; lining the metal layer with a barrier layer; annealing the source/drain region and the metal layer to form a silicide; and forming a conductor material atop the silicide and the barrier.

One general aspect of certain embodiments disclosed herein includes a device including a multi-gate transistor, the multi-gate transistor including a source/drain region, and a dielectric layer overlying the source/drain region, The device also includes a filled contact opening extending through the dielectric layer, the filled contact opening defined by sidewalls of the dielectric layer; and a metal liner extending along and contacting the sidewalls of the dielectric layer. A barrier layer extends along and contacts the metal liner, the metal liner being interjacent the barrier layer and the sidewalls of the dielectric layer. The device further includes a silicide of the source/drain region and the metal liner at a bottom of the filled contact opening, and a conductor within the filled contact opening, the barrier layer extending between the conductor and the silicide.

Another general aspect of certain embodiments disclosed herein includes a method of forming a device, including: forming a multi-gate transistor, the multi-gate transistor including a source/drain region and a channel region, depositing a dielectric layer over the source/drain region, and patterning the dielectric layer to form an opening, the opening exposing a portion of the source/drain region. The method further includes lining with a metal liner sidewalls and the exposed portion of the source/drain region, lining the metal liner with a barrier layer, and annealing the metal liner and the source/drain region to form a silicide of the metal liner material and the source/drain region material. The method further includes depositing a fill metal within the opening.

Yet another general aspect of certain embodiments disclosed herein includes a device, including: a channel region; a gate conductor at least partially surrounding the channel region, and a source/drain region on one side of the channel region. The device also includes a dielectric layer overlying the source/drain region, and a contact extending through the dielectric layer and electrically contacting the source/drain region. The contact includes a conductive core, a barrier layer lining the conductive core, and a metal layer lining the barrier layer, the metal layer being between the barrier layer and the dielectric layer, and a silicide of the source/drain region and the metal layer between the source/drain region and the barrier layer, the barrier layer separating the silicide and the conductive core.

Advantageous features of some embodiments disclosed herein may include forming p-type structure and an n-type structure on a substrate. The method also includes depositing an isolation layer between the p-type structure and the n-type structure. The method also includes forming a first dummy gate on the p-type structure, the dummy gate leaving portions of the p-type structure exposed. The method also includes forming a second dummy gate on the n-type structure, the dummy gate leaving portions of the n-type structure exposed. The method also includes removing an exposed portion of the p-type structure to form a recessed portion of the p-type structure. The method also includes removing an exposed portion of the n-type structure to form a recessed portion of the n-type structure. The method also includes epitaxially growing a first source/drain region on the recessed portion of the p-type structure. The method also includes epitaxially growing a second source/drain region on the recessed portion of the n-type structure. The method also includes replacing the first dummy gate and the second dummy gate with a first replacement gate and a second replacement gate, respectively. The method also includes depositing a dielectric layer on the first source/drain region and the second source/drain region and patterning the dielectric layer to expose the first source/drain region and the second source/drain region. The method also includes depositing a metal layer on the exposed first source/drain region and along sidewalls of the patterned dielectric layer. The method also includes and depositing a barrier layer on the metal layer. The method also includes performing an annealing step to form a silicide of the first source/drain region and the metal layer.

Advantageous features of other embodiments disclosed herein may include forming an n-type structure interjacent two p-type structures on a substrate. The method also includes forming a gate structure over the n-type structure and the p-type structures, where the gate structure leaves uncovered respective source/drain regions of the n-type structure and p-type structures. The method also includes depositing a dielectric layer over the respective source/drain regions. The method also includes patterning the dielectric layer to form openings therein, the openings exposing the respective source/drain regions. The method also includes lining the openings with a metal liner. The method also includes lining the metal liner with a barrier layer. The method also includes and performing an annealing process to form a silicide of the metal liner and the respective source/drain regions, where portions of the metal liner in contact with the respective source/drain regions are fully consumed during the annealing process, and where the barrier layer remains unconsumed after the annealing process.

Advantageous features of et other embodiments disclosed herein may include an n-type channel-region-containing structure interjacent two p-type channel-region-containing structures. The device also includes a gate structure extending over the n-type channel-region-containing structure and the p-type channel-region-containing structures. The device also includes each channel-containing region including a respective source/drain region. The device also includes a dielectric layer overlying the respective source/drain regions. The device also includes each source/drain region having associated therewith a filled contact opening extending through the dielectric layer, the filled contact opening defined by sidewalls of the dielectric layer. The device also includes a metal liner extending along and contacting the sidewalls of the dielectric layer. The device also includes a metal barrier layer extending along and contacting the metal liner, the metal liner being interjacent the metal barrier layer and the sidewalls of the dielectric layer. The device also includes a silicide of the source/drain region and the metal liner at a bottom of the filled contact opening. The device also includes a conductor within the filled contact opening, the metal barrier layer extending between the conductor and the silicide and the metal barrier layer directly contacting the silicide, where the metal barrier layer physically prevents the conductor from contacting the silicide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming p-type structure and an n-type structure on a substrate;
    depositing an isolation layer between the p-type structure and the n-type structure;
    forming a first dummy gate on the p-type structure, the first dummy gate leaving portions of the p-type structure exposed;
    forming a second dummy gate on the n-type structure, the second dummy gate leaving portions of the n-type structure exposed;
    removing an exposed portion of the p-type structure to form a recessed portion of the p-type structure;
    removing an exposed portion of the n-type structure to form a recessed portion of the n-type structure;
    epitaxially growing a first source/drain region on the recessed portion of the p-type structure;
    epitaxially growing a second source/drain region on the recessed portion of the n-type structure;
    replacing the first dummy gate and the second dummy gate with a first replacement gate and a second replacement gate, respectively;
    depositing a dielectric layer on the first source/drain region and the second source/drain region and patterning the dielectric layer to expose the first source/drain region and the second source/drain region;
    depositing a metal layer on the exposed first source/drain region and along sidewalls of the patterned dielectric layer; and
    depositing a barrier layer on the metal layer; and
    performing an annealing step to form a silicide of the first source/drain region and the metal layer, wherein the silicide contacts the barrier layer after the annealing step.

2. The method of claim 1, wherein a portion of the metal layer between the barrier layer and the first source/drain region is reacted with the first source/drain region, so that the metal layer is not present between the barrier layer and the silicide after the annealing step.

3. The method of claim 1, further comprising forming a conductor filling the opening, wherein the conductor is an interconnect structure in the dielectric layer.

4. The method of claim 1, wherein the annealing step is performed at an annealing temperature less than 700 degrees Celsius for an annealing duration less than 120 seconds.

5. The method of claim 1, wherein after the annealing step the Si concentration of the silicide varies along a height of the silicide.

6. The method of claim 1, further comprising:
    depositing another metal layer on the exposed second source/drain region and along sidewalls of the patterned dielectric layer;
    depositing a second barrier layer on the another metal layer; and
    performing an annealing step to form a second silicide of the second source/drain region and the another metal layer.

7. The method of claim 6, wherein the metal layer and the another metal layer are the same material and wherein the barrier layer and the second barrier layer are the same material.

8. The method of claim 1, further comprising etching a top portion of the first source/drain region and a second top portion of the second source/drain region.

9. The method of claim 8, wherein etching a top portion of the first source/drain region and a second top portion of the second source/drain region occurs during the step of patterning the dielectric layer to expose the first source/drain region and a second top portion of the second source/drain region.

10. The method of claim 9 wherein etching a top portion of the first source/drain region smooths a faceted top surface of the first source/drain region.

11. A method comprising:
    forming an n-type structure interjacent two p-type structures on a substrate;
    forming a gate structure over the n-type structure and the p-type structures, wherein the gate structure leaves uncovered respective source/drain regions of the n-type structure and p-type structures;
    depositing a dielectric layer over the respective source/drain regions;
    patterning the dielectric layer to form openings therein, the openings exposing the respective source/drain regions;
    lining the openings with a metal liner;
    lining the metal liner with a barrier layer; and
    performing an annealing process to form a silicide of the metal liner and the respective source/drain regions, wherein portions of the metal liner in contact with the respective source/drain regions are fully consumed during the annealing process, and wherein the barrier layer remains unconsumed after the annealing process.

12. The method of claim 11, further comprising:
    recessing one or more of the uncovered respective source/drain regions; and
    epitaxially growing semiconductor material on the recessed one or more uncovered respective source/drain regions.

13. The method of claim 12 wherein the epitaxially grown semiconductor material forms a faceted top surface on at least one source/drain region and further comprising etching back the faceted top surface.

14. The method of claim 12, wherein the step of epitaxially growing semiconductor material on the recessed one or more uncovered respective source/drain regions forms a first source/drain region having a faceted surface and a second source/drain region having a surface that is less faceted than the faceted surface of the first source/drain region.

15. The method of claim 11, further comprising:
    depositing a fill metal onto the silicide to form an electrical contact with the respective source/drain regions.

16. The method of claim 11, wherein the step of forming an n-type structure interjacent two p-type structures on a substrate includes forming an n-type nanowire.

17. The method of claim 11, wherein a Si concentration varies in the silicide when progressing from the top to the bottom of the silicide.

18. A device comprising:
- an n-type channel-region-containing structure interjacent two p-type channel-region-containing structures;
- a gate structure extending over the n-type channel-region-containing structure and the p-type channel-region-containing structures;
- each channel-containing region including a respective source/drain region;
- a dielectric layer overlying the respective source/drain regions;
- each source/drain region having associated therewith a filled contact opening extending through the dielectric layer, the filled contact opening defined by sidewalls of the dielectric layer;
- a metal liner extending along and contacting the sidewalls of the dielectric layer;
- a metal barrier layer extending along and contacting the metal liner, the metal liner being interjacent the metal barrier layer and the sidewalls of the dielectric layer;
- a silicide of the source/drain region and the metal liner at a bottom of the filled contact opening; and
- a conductor within the filled contact opening, the metal barrier layer extending between the conductor and the silicide and the metal barrier layer directly contacting the silicide, wherein the metal barrier layer physically prevents the conductor from contacting the silicide.

19. The device of claim 18, wherein a Si concentration of the silicide decreases along the height of the silicide.

20. The device of claim 18, wherein the respective channel-containing regions are nanowires formed on a common semiconductor substrate.

\* \* \* \* \*